P-N JUNCTION HAVING MINIMUM TRANSITION LAYER CAPACITANCE

Filed Dec. 26, 1958 2 Sheets-Sheet 1

WILLIAM SHOCKLEY
*INVENTOR.*

BY
Flehr and Swain
ATTORNEYS

Sept. 20, 1960 W. SHOCKLEY 2,953,488

P-N JUNCTION HAVING MINIMUM TRANSITION LAYER CAPACITANCE

Filed Dec. 26, 1958 2 Sheets-Sheet 2

WILLIAM SHOCKLEY
*INVENTOR.*

BY

Flehr and Swain
ATTORNEYS

United States Patent Office 2,953,488
Patented Sept. 20, 1960

2,953,488

P-N JUNCTION HAVING MINIMUM TRANSITION LAYER CAPACITANCE

William Shockley, 23466 Corta Via, Los Altos, Calif.

Filed Dec. 26, 1958, Ser. No. 783,026

12 Claims. (Cl. 148—33)

This invention relates generally to a p-n junction and more particularly to a p-n junction having minimum transition layer capacitance, and more particularly to an improved emitter junction.

A p-n junction, as well as rectifying electrical current flow, exhibits capacitance. The capacitance in a p-n junction arises from two separable sources, minority carrier storage and transition region capacitance.

Injected minority carriers into the two regions adjacent to the junction can be stored for a time comparable to the lifetime of the minority carriers. This stored charge behaves in a circuit as if it were charge stored in a capacitor.

The transition region itself also adds capacitance. For most transistor applications, the capacitance arising from the transition region is an undesired dead load. The charge on the transition region capacitance is that necessary to produce a change in bias across the p-n junction to produce injection of minority carriers. The latter effect is that usually desired in an operating transistor device.

It is a general object of the present invention to provide a p-n junction having minimum transition layer capacitance.

It is another object of the present invention to provide an improved emitter junction for a junction semiconductive device.

It is another object of the present invention to provide a p-n junction in which the transition region is tailored to minimize the transition region capacitance.

It is another object of the present invention to provide an emitter junction having improved characteristics.

It is still a further object of the present invention to provide a junction transistor including an emitter having minimum transition region capacitance.

These and other objects of the invention will be more clearly understood from the following description when read in conjunction with the accompanying drawing.

Referring to the drawing.

Figure 1:
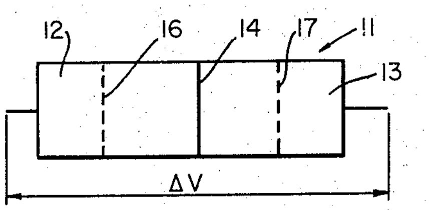
Figure 1 shows a pair of regions of opposite conductivity type forming a p-n junction.

Referring to Figure 1, there is illustrated a body of semiconductive material 11, for example, silicon or germanium. The body has a uniform p-type region 12 and a uniform n-type region 13 forming a rectifying junction 14. The uniform regions 12 and 13 are separated by a region of varying chemical composition delineated generally by the dotted lines 16 and 17. A forward bias $\Delta V$ is illustrated as applied across the junction.

Considering only capacitance effects, the model may be conceptually simplified by neglecting recombination entirely between holes and electrons. Under these conditions, the forward bias $\Delta V$ corresponds to a difference in the quasi-Fermi levels or imrefs between holes and electrons corresponding to the applied potential $\Delta V$. The hole and electron density product will then be constant throughout the structure.

Figure 2:
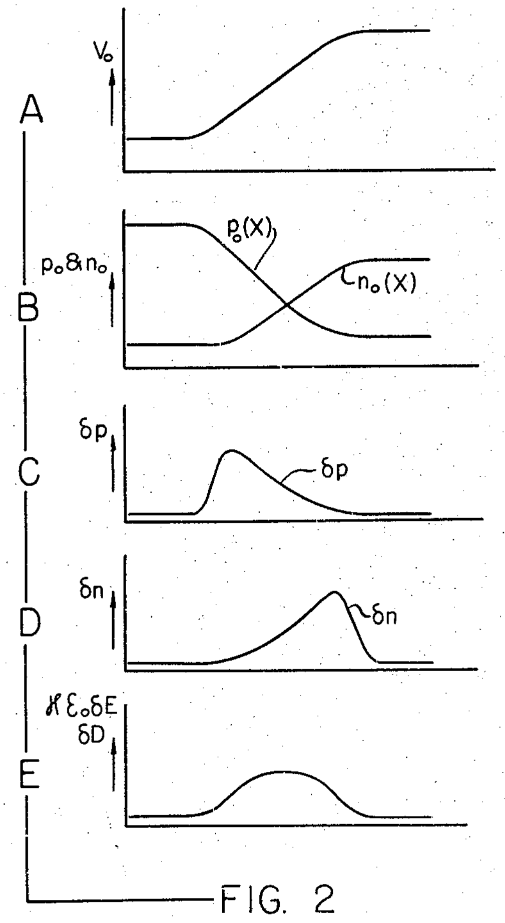
Figure 2 shows the potential distribution and other features of the p-n junction of Figure 1.

Figure 2 shows the potential distribution and other features of the p-n junction. In Figure 2A, the D.-C. potential denoted by $V_0$ is represented as a function of distance along a line perpendicular to the plane of the transition region. In the p-type region represented to the left of the figure and the n-type region to the right, the potential is constant and there is no electric field. The hole and electron densities $p_0\ (x)$ and $n_0\ (x)$ are represented in Figure 2B.

The remaining portions of Figure 2 illustrate the changes which are produced by an increase of $\delta\Delta V$ in the forward bias. This increase in forward bias causes increased injection of minority carriers in the two uniform regions on either side of the transition region. The number of carriers of both types injected in each of the two regions is equal (unless trapping of carriers occurs to alter the chemical charge density) and produces no electric field in the uniform regions. The applied potential changes the potential drop across the transition region. The potential drop is produced by a dipole distribution of charge in the transition region. This dipole distribution is represented in Figures 2C and 2D. Due to the increase in forward bias, the potential rise in $V_0$, Figure 2A, is decreased and accordingly, holes tend to move deeper and more abundantly into the transition region. This will produce an increase of $\delta p$ in the hole density throughout the transition region, this increase being largest a slight distance into the transition region, Figure 2C. A similar increase of $\delta n$ will occur for the electron density in the transition region, Figure 2D.

Figure 2E shows the resultant change in electric field $\delta E$ and the corresponding change in dielectric displacement. The integral of electric field across the transition region gives the change in potential across the transition region. Under most circumstances, this change in potential will be equal to the change in the applied voltage for all practical purposes. More exactly speaking, it is slightly less owing to the fact that the increase in forward bias really applies to the imrefs for holes and electrons and since the densities of majority carriers increase slightly, the electrostatic potential does not change quite as much as the imrefs.

To understand how the transition region capacity arises and how it may be calculated, the currents which must flow in order to produce the changes in hole and electron densities represented in Figures 2C and 2D must be considered. An increase $\delta\Delta V$ in applied potential produces a current of holes to flow from a contact through the p-type region and an equal current of electrons to flow in the n-type region toward the p-n junction to establish a new equilibrium. There are more holes present in the specimen of material and also more electrons than there was prior to the increase. This increased number corresponds to a flow of net charge of opposite signs into the two terminals, just as if a condenser were being charged. The amount present can be obtained by integrating $\delta p$ and $\delta n$ represented in Figures 2C and 2D over the structure. The contribution may be divided into three parts: (1) the added holes in the p-type region itself. These are equal to the added electrons if there is no trapping of current carriers which would alter the chemical change density. In this region, the hole and electron densities are uniform in accordance with the assumption that recombination, which would produce concentration gradients and diffusion currents, is neglected. (2) The increase in holes in the region where the added hole concentration is varying, the transition region between 16 and 17 of Figure 1, and (3) added holes injected into the n-type region. As for the p-type region, this charge is equal to the added electrons in that region. Thus, the added charge required to produce the increased potential $\delta\Delta V$ arises from three separable terms: injected electrons in the p-type region, injected holes in the n-type region, and added carriers in the transition region. It is the latter carriers which produce the transition region capacitance.

The added carriers per unit area of the transition region are represented in Figures 2C and 2D by the area under the curves and are given by $$\delta P=\int_{x_p}^{x_n}\delta p dx=\delta N=\int_{x_p}^{x_n}\delta n dx \qquad (1)$$

where $x_p$ and $x_n$ are the coordinates of planes 16 and 17 of Figure 1. The equality between $\delta P$ and $\delta N$ arises from the fact that the added electric field $\delta E$ is zero on both plane 16 and plane 17, and consequently the total added charge between these two planes must be zero.

The differential capacity of the transition region is defined as the ratio of the increment in charge $q\delta P$ to the increment in voltage $\delta\Delta V$:

$$C=q\delta P/\delta\Delta V \qquad (2)$$

Two simplified models of a transition region for which $\delta P$ and $\delta N$ can be calculated relatively easily will be discussed below. It will be seen that two effects enter of such a nature that if the transition region is made very narrow, one effect dominates, whereas if it is made very broad, the other effect dominates. In both cases, the capacity becomes larger as more extreme cases are approached. Thus, there is a transition region which gives minimum transition layer capacitance.

With a forward bias $\Delta V$ applied across the junction 14, the hole and electron densities have a product which is larger than their product in intrinsic material at the same temperature by the Boltzmann factor for the applied forward potential. Accordingly $$np=n_i^2 \exp(\Delta V/V_\theta)=N_e^2 \qquad (3)$$

where $n_i^2$ is the product in intrinsic material, and $V_\theta$ is the thermal voltage given by:

$$V_\theta=kT/q \qquad (4)$$

where T is temperature and $k$ is a constant.

The symbol $n_e$ in Equation 3 represents the hole or electron density at the point in the p-n junction where the two densities are equal. It is a sort of pseudo-intrinsic density for the case where forward bias is applied and may, of course, be many times larger than the intrinsic density. This density plays a major role in determining the minimum capacitance for the transition region. If the transition region is made very broad, then the hole and electron densities tend to become equal in the junction, both being equal to $n_e$ so as to produce a neutral or pseudo-intrinsic region throughout the junction. Carriers stored in this region tend to increase the capacity of the junction. The critical quantity associated with $n_e$ is the Debye length $L_e$. The Debye length is derived in the customary way by considering Poisson's equation in a region in which there is no chemical charge density and the hole and electron densities are perturbed slightly from their pseudo-intrinsic value $n_e$, see W. Shockley, Bell System Technical Journal 1949.

If $v$ represents the deviation in potential in the semiconductor from the value which would produce equal hole and electron desities, then for small values of $v$, the Boltmann factors may be approximated in the usual way, so that we may write for Poisson's equation:

$$\kappa\epsilon_0 d^2v/dx^2=2qn_e v/V_\theta \qquad (5)$$

This equation can be put in very simple form if lengths are measured in units of the Debye length, $L_e$, given by:

$$L_e=(\kappa\epsilon_0 V_\theta/2qn_e)^{1/2} \qquad (6)$$

and potential is measured in units of thermal voltage. Under these conditions, it is found that small disturbances in potential increase exponentially by a factor of $e$ (the base of the natural logarithms) for each change in distance equal to a Debye length.

Figure 3:
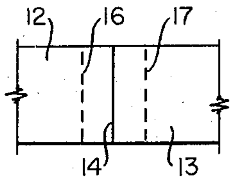
Figure 3 shows a narrow p-n junction.
Figure 4:
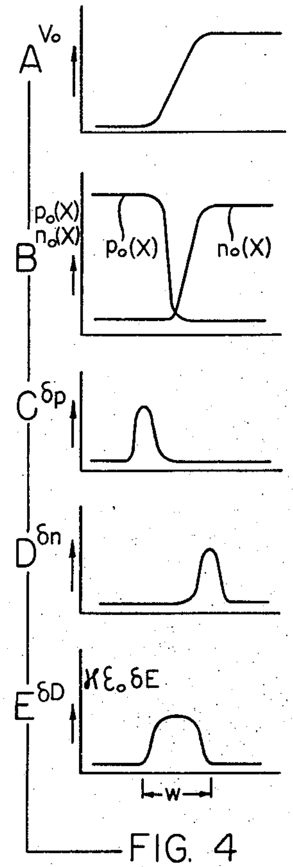
Figure 4 shows the potential distribution and other features of the p-n junction of Figure 3.

The potential distribution and other features of a narrow p-n junction, Figure 3, is shown in Figures 4A–E. The transition region is small compared to a Debye length for the pseudo-intrinsic density. For this case, the charge densities of holes and electrons in the transition region do not perturb the potential distribution appreciably and most of the charge $\delta P$ and $\delta N$ are concentrated at the edges of the heavily doped and uniform p and n-type regions. The added electric field in this case is simply given in terms of $\delta P$ and the dielectric constant $\kappa\epsilon_0$. This leads to the usual capacity formula for a capacitor of dielectric constant $\kappa\epsilon_0$ given by:

$$C_1=\kappa\epsilon_0/W \qquad (7)$$

where W is the spacing of Figure 4E and $C_1$ is the capacity.

Changes in the charge due to added holes $\delta P$ occur at the edge of the uniform p-type region and extend into it by approximately a Debye length corresponding to the majority carrier density in the n-type region. Since this will, in general, be many times larger than the carrier density $n_e$, this causes the charge density to be highly localized at the two edges of the dielectric layer and gives rise to the simple relationship of Equation 7.

Figure 5:
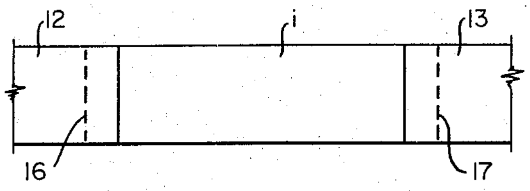
Figure 5 shows a p-i-n junction.
Figure 6:
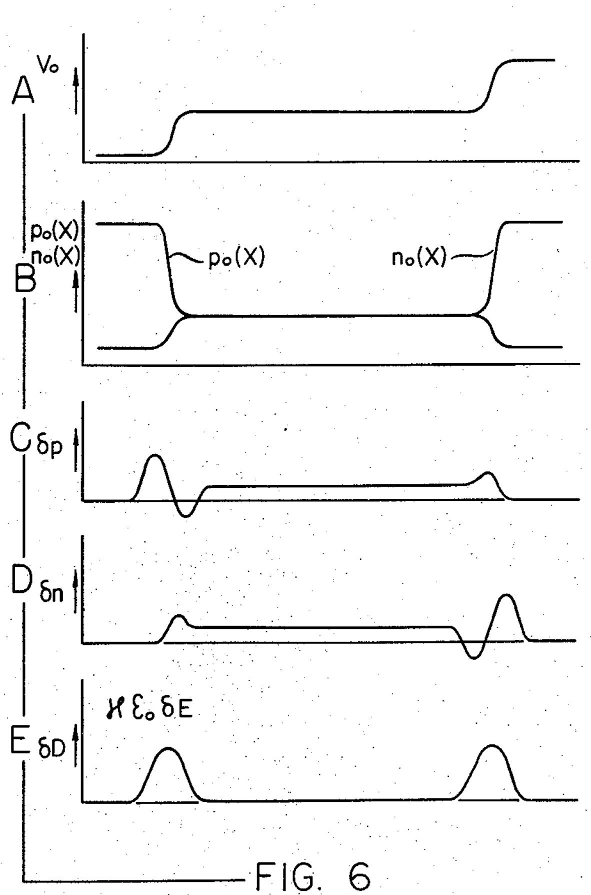
Figure 6 shows the potential distribution and other features of the p-i-n junction of Figure 5.

A p-n junction of the form p+,i,n+ is shown in Figure 5 with an intrinsic region which is many Debye lengths wide. The potential distribution and other features of the wide p-n junction are shown in Figures 6A–E. Under these conditions, the middle part of the $i$ region will be pseudo-intrinsic and will be neutral. The potential will be substantially constant through this region and will deviate significantly over a range of approximately one Debye length at both ends. This situation is represented in Figure 6A. The corresponding hole and electron densities are indicated in Figure 6B of the figure. An increase in forward bias $\delta\Delta V$ across the junction increases the pseudo-intrinsic density and decreases the potential drops shown at the ends of the two regions. It does not produce any electric field throughout the middle portion of the pseudo-intrinsic region. It is evident from this that the increases in electron and hole densities will be approximately as represented in Figures 6C and D, and the electric field will be as represented in Figure 6E. (Since they do not enter the calculations, the densities in the dipole layers are approximate.)

For a junction which is many Debye lengths wide, the increase in stored holes can be calculated by simply multiplying the increase in $\delta p$ in the neutral part of the region by the total width of the neutral region. Alternatively, one can calculate the capacity by differentiating the total charge of stored holes in the intrinsic region with respect to the forward bias.

The total number of stored holes is given by:

$$P=Wn_e=Wn_1 \exp(\Delta V/2V_\theta) \qquad (8)$$

and accordingly, the transition region capacity for this model is given by:

$$C_2=qdP/d(\Delta V)=qWn_e/2V_0=\kappa\epsilon_0 W/4L_e^2 \qquad (9)$$

Thus, we see for this case that the approximation $C_2$ for the capacitance is directly proportional to the width of the transition region whereas, for a situation in which the narrow junction approximation applies, the capacitance is inversely proportional to the width.

An approximation for the capacitance for a junction of width W may be obtained by adding the formula for $C_1$, Equation 7, and the formula for $C_2$, Equation 9, so as to produce a total capacitance. Proceeding with this approximation, we may write:

$$C_3=C_1+C_2=(\kappa\epsilon_0/2L_e)[(2L_e/W)+(W/2L_e)] \quad (10)$$

It is seen, when the equation is written in the form above, that the two additive terms are reciprocals of each other. The sum of two reciprocal numbers is a minimum when the two numbers are equal and both equal to unity. Accordingly, the minimum capacitance occurs when $$W=2L_e \quad (11)$$

The coefficient in front of the sum in Equation 10 may be expressed as a capacitance per unit area which depends upon the pseudo-intrinsic densities $n_e$ $$C(n_e)=\kappa\epsilon_0/L_e=(2\kappa\epsilon_0 qn_e/V_0)^{1/2} \quad (12)$$

The minimum capacitance given by Equation 10 thus turns out to be simply:

$$C_3(\text{minimum})=C(n_e) \quad (13)$$

In the neighborhood of the minimum, the capacitance given by Equation 10 varies as follows:

*Table I*

$W/2L_e$=0.01,0.1,0.3,1,3,10,100
$C/C(n_e)$=50,5.5,1.8,1,1.6,5.5,50

The capacity exceeds twice the minimum value when W differs from $2L_e$ by a factor greater than 3.7.

Thus, if a forward bias is applied across the p-n junction, such that a pseudo-equilibrium density $n_e$ exists, then the transition region capacitance will be a minimum when its width is the order of 2 Debye lengths wide and its value will depend upon the square root of the pseudo-intrinsic density. It is evident that if the width of the p-n junction differs by a factor of ten from the value $2L_e$ given by 11 capacitance values five times larger than the minimum value may well arise.

An example is furnished by the case of a junction transistor operating so that the base region is not quite saturated, so that the product of hole and electron densities in the base region is about 1/10 of the square of the majority carrier density and $n_e$ is about 1/3 of the majority carrier density in the base, and the Debye length $L_e$ is thus about 1.7 times the Debye length produced by majority carriers in the base layer.

An exact mathematical treatment shows that the p-n junction having minimum capacitance consists of an intrinsic layer with a width of $\pi L_e$ and for this case the capacity is $\pi C(n_e)/4$ or $0.785C(n_e)$. It can also be seen from that analysis that any form of junction, having a reasonably smooth transition of potential, of the order of several Debye lengths will have a capacity of about $C(n_e)$. A simplified form of the reasoning is as follows:

From the reasoning given in connection with Equations 5 and 6, it can be shown that the electric field produced by an A.C. voltage across a p-n junction tends to attenuate exponentially where it extends into the p-type and n-type regions. The attenuation distance at any position is approximately the Debye length at that position. The Debye length is, in general, determined by the sum of $n$ and $p$, and consequently varies as $\cosh(qV(x)/kT)$ where $V(x)$ is the change in electrostatic potential between position $x$ at the place where $n$ and $p$ both equal $n_e$. From this, it follows that the Debye length is approximately halved when $V(x)$ becomes equal to $2kT/q$. For the junction of minimum capacitance, the potential remains of the order of $kT/q$ for a distance of about one Debye length $L_e$ on either side of the plane where $n$ and $p$ are both equal to $n_e$, referred to as the "equality plane." For the exact minimum case, the field can extend over a distance of more than two Debye lengths so that the contribution corresponding to the term discussed in Equation 7 is less than $C(n_e)$.

In order for the potential to remain of the order of $kT/q$ for a distance of $L_e$ on each side of the center, it is evident that the contribution to the potential due to chemical charge density must be kept sufficiently small. A uniform charge density $\rho$ produces an increase in electric field given by $$E=\rho L/\kappa\epsilon_0 \quad (14)$$

in a distance L and the potential is about $$EL=\rho L^2/\kappa\epsilon_0 \quad (15)$$

If we set this equal to $kT/q=V_0$ and let $L=L_e$, the value of $\rho$ becomes $$\rho=V_0\kappa\epsilon_0/L(n_e)^2=2qn_e \quad (16)$$

Thus, it follows that if the chemical charge density is smaller than $2qn_e$, it does not produce a very important effect within one Debye length of the center of the junction.

On the other hand, the minority carrier density must become small compared to $n_e$ within about two lengths $L_e$ of the junction, otherwise the effect of injected carriers in the transition region will cause the term corresponding to Equation 9 to become larger than $C(n_e)$.

As mentioned above, an exact treatment shows that the ideal junction corresponds to an intrinsic layer, i.e., zero chemical charge density, $\pi L_e$ wide bounded by layers of very large densities. The reasoning presented above following Equation 16 shows that the minimum will be closely approached provided the chemical density is not much larger than $qn_e$ within a Debye length of the plane where $n$ and $p$ are equal. On the other hand, the majority carrier density must be much larger than $n_e$ at $2L_e$ from the equality plane, or else the injection capacity will be much larger than the minimum value. This latter condition is approximately equivalent to having the chemical charge density rise to values larger than $2n_e$ within $2L_e$ of the "equality" plane.

From this, it follows that if the junction has a chemical charge density which lies between $-2qn_e$ and $2qn_e$ over a length of $2L_e$ and lies outside $-2qn_e$ and $2qn_e$ for some points outside but within $L_e$ of the two extremes of the first length, a transition region with a satisfactory compromise between abruptness and gradualness will be achieved. It is believed that the capacity of such a junction will be within a factor of two or three of the exact minimum and the effect of emitter capacitance at higher frequencies will reduce the gain by less than 3 db below that for the exact minimum junction. For values lying outside of these bounds, shown in Table I, values of $C/C(n_e)$ as high as 5 or 10 may easily occur.

As was seen in Table I, approximately a four-fold variation in width can occur before the capacity increases by a factor of two from its minimum value. If a satisfactory junction is taken to be one in which the capacity is within a factor of two of the minimum, then the condition on the upper and lower bounds for length just discussed should be extended by a factor of 4: The chemical charge density should lie between $-2qn_e$ and $+2qn_e$ over a length of $L_e/2$ and should lie outside $-2qn_e$ and $+2qn_e$ within $6L_e$ of each end of the first length.

From the foregoing analysis, it is evident that for a given level of operation for a given base-layer structure, the value of $n$ times $p$ in the base is determined. Hence, the quantity $n_e$, Equation 3, and the Debye length $L_e$, Equation 6, are determined, and the criteria just discussed can be applied.

Emitter capacitance for the transition region has an important effect upon the operation of transistors. (See, for example, C. A. Lee "A High Frequency Diffused Base Germanium Transistor," Bell System Tech. J., vol. 35, pages 23–35, 1956, text on pages 26 and 27, and Thornton and Angell Technology of Micro-Alloy Diffused Transistors Proc. I.R.E., vol. 46 p. 1166, 1958, text on page 1170.) However, no suggestion of how to achieve a minimum is given and it is probable that $C/C(n_e)$ values as high as 10 are occurring due to poor design.

As previously described, to minimize the transition region capacitance, the transition region should be several Debye lengths wide. What this requires is that the chemical charge density should vary at a rate lying between certain limits. Thus, within about one Debye length of the plane of zero chemical charge density, the chemical charge density should be small compared to $qn_e$, and at more than two Debye lengths it should be large compared to $qn_e$. This will lead to a transition region having an effective width of about three Debye lengths, and thus a transition capacity close to the minimum of $\pi C(n_e)/4$ discussed above.

In transistors having diffused base and emitter structures, the concentration gradient at the emitter junction can be controlled by controlling the depth of diffusion of the emitter impurity. Alternatively, once a base layer has been diffused, a decrease of its concentration near the surface may be effected by out-diffusion or by diffusing in a compensating impurity. This can be used to widen the transition region prior to diffusing or alloying a highly concentrated emitter layer. See, for example, F. M. Smits "Formation of Junction Structures by Solid-State Diffusion," Proc. I.R.E., vol. 46, page 1049, 1958.)

Figure 7:
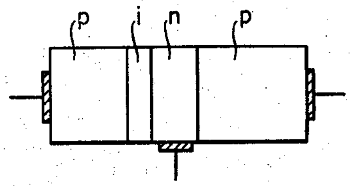
Figure 7 shows a transistor incorporating a p-n junction in accordance with the present invention.

Referring to Figure 7, a p-n-p transistor including an emitter junction in accordance with the present invention is shown. The intrinsic region *i* is illustrative of the transition region in accordance with the invention.

Thus, there is provided a p-n junction which introduces minimum transition region capacitance. The junction is suitable for use as the emitter region of high frequency transistors.

I claim:

1. A junction transistor comprising an emitter region of one conductivity type, a base region of opposite conductivity type forming a junction therewith, said junction having an equality plane where *n*, the electron density, and *p*, the hole density, are equal, the absolute value of the chemical charge density being less than $qn_e$ within a length $L_e$ of the equality plane and rising to values greater than $2qn_e$ within a width $2L_e$ of the equality plane, where $$L_e=(\kappa\epsilon_0 V/_\theta/2qn_e)^{1/2}$$

$\kappa\epsilon_0$ equals the dielectric constant; $V_\theta$ equals the thermal voltage; and $n_e$ equals $(np)^{1/2}$, and a collector region.

2. A junction transistor comprising an emitter region of one conductivity type, a base region of opposite conductivity type having an emitter junction, said junction having a chemical charge density which lies between $-2qn_e$ and $+2qn_e$ over a length $L_e$ on each side of the junction and is greater than $-2qn_e$ and $+2qn_e$ for distances greater than $L_e$ but less than $2L_e$ on each side of said junction, where $$L_e=(\kappa\epsilon_0 V_\theta/2qn_e)^{1/2}$$

$\kappa\epsilon_0$ equals the dielectric constant; $V_\theta$ equals the thermal voltage; $n_e$ equals $(np)^{1/2}$; *n* is the electron density at a point in said region; and *p* is the hole density at the same point, and a collector region.

3. A junction transistor comprising an emitter region of one conductivity type, a base region of opposite conductivity type forming a junction therewith, said emitter junction having a transition region of a width between 1 and $4L_e$ where $$L_e=(\kappa\epsilon_0 V_\theta/2qn_e)^{1/2}$$

$\kappa\epsilon_0$ equals the dielectric constant; $V_\theta$ equals the thermal voltage; $n_e$ equals $(np)^{1/2}$; *n* is the electron density at a point in said region; and *p* is the hole density at the same point, and a collector region.

4. A junction transistor comprising an emitter region of one conductivity type, a base region of opposite conductivity type forming a junction therewith, said emitter junction having a transition region of a width between 1 and $6L_e$ where $$L_e=(\kappa\epsilon_0 V_\theta/2qn_e)^{1/2}$$

$\kappa\epsilon_0$ equals the dielectric constant; $V_e$ equals the thermal voltage; $n_e$ equals $(np)^{1/2}$; *n* is the electron density at a point in said region; and *p* is the hole density at the same point, and a collector region.

5. A junction transistor comprising an emitter region of one conductivity type, a base region of opposite conductivity type forming an emitter junction therewith, said emitter junction having a chemical charge density distribution which is less than $2qn_e$ in a region of said junction $L_e/2$ wide and rises to values greater than $2qn_e$ within distances less than $6L_e$ from either boundary of said junction region where $$L_e=(\kappa\epsilon_0 V_\theta/2qn_e)^{1/2}$$

$\kappa\epsilon_0$ equals the dielectric constant; $V_\theta$ equals the thermal voltage; $n_e$ equals $(np)^{1/2}$; *n* is the electron density at a point in said region; and *p* is the hole density at the same point, and a collector region.

6. A p-n junction comprising a first region of one conductivity type and a second region of opposite conductivity type forming a junction therewith, said junction having an equality plane where *n*, the electron density, and *p*, the hole density are equal, the absolute value of the chemical charge density being less than $qn_e$ within a length $L_e$ of the equality plane and rising to values greater than $2qn_e$ with a width $2L_e$ of the equality plane, where $$L_e=(\kappa\epsilon_0 V_\theta/2qn_e)^{1/2}$$

$\kappa\epsilon_0$ equals the dielectric constant; $V_\theta$ equals the thermal voltage; and $n_e$ equals $(np)^{1/2}$.

7. A p-n junction comprising a first region of one conductivity type and a second region of opposite conductivity type forming a junction therewith, said junction having a chemical charge density which lies between $-2qn_e$ and $+2qn_e$ over a length $L_e$ on each side of the junction and is greater than $-2qn_e$ and $+2qn_e$ for distances greater than $L_e$ but less than $2L_e$ on each side of said junction, where $$L_e=(\kappa\epsilon_0 V_\theta/2qn_e)^{1/2}$$

$\kappa\epsilon_0$ equals the dielectric constant; $V_\theta$ equals the thermal voltage; $n_e$ equals $(np)^{1/2}$; *n* is the electron density at a point in said region; and *p* is the hole density at the same point.

8. A p-n junction comprising a first region of one conductivity type and a second region of opposite conductivity type forming a junction therewith, said junction having a transition region of a width between 1 and $4L_e$ where $$L_e=(\kappa\epsilon_0 V_\theta/2qn_e)^{1/2}$$

$\kappa\epsilon_0$ equals the dielectric constant; $V_\theta$ equals the thermal voltage; $n_e$ equals $(np)^{1/2}$; *n* is the electron density at a point in said region; and *p* is the hole density at the same point.

9. A p-n junction comprising a first region of one conductivity type and a second region of opposite conductivity type forming a junction therewith, said junction having a transition region of a width between 1 and $6L_e$ where $$L_e=(\kappa\epsilon_0 V_\theta/2qn_e)^{1/2}$$

$\kappa\epsilon_0$ equals the dielectric constant; $V_\theta$ equals the thermal voltage; $n_e$ equals $(np)^{1/2}$; *n* is the electron density at a point in said region; and *p* is the hole density at the same point.

10. A p-n junction comprising a first region of one conductivity type and a second region of opposite conductivity type forming a junction therewith, said junction having a chemical charge density distribution which is less than $2qn_e$ in a region of said junction $L_e/2$ wide and rises to values greater than $2qn_e$ within distances less than $6L_e$ from either boundary of said junction region where $$L_e=(\kappa\epsilon_0 V_\theta/2qn_e)^{1/2}$$

$\kappa\epsilon_0$ equals the dielectric constant; $V_\theta$ equals the thermal voltage; $n_e$ equals $(np)^{1/2}$; $n$ is the electron density at a point in said region; and $p$ is the hole density at the same point.

11. A junction transistor comprising an emitter region of one conductivity type having a relatively high chemical charge density, a base region of opposite conductivity type having a relatively high chemical charge density, a substantially intrinsic region contiguous with and separating said emitter and base regions, said intrinsic region being substantially $\pi L_e$ in length where $L_e$ is given by $$L_e=(\kappa\epsilon_0 V_\theta/2qn_e)^{1/2}$$

$\kappa\epsilon_0$ equals the dielectric constant; $V_\theta$ equals the thermal voltage; $n_e$ equals $(np)^{1/2}$; $n$ is the electron density at a point in said region; and $p$ is the hole density at the same point.

12. A p-n junction comprising a first region of one conductivity type having a relatively high chemical charge density, a second region of opposite conductivity type having a relatively high chemical charge density, and a substantially intrinsic region contiguous with and separating said regions, said intrinsic region being substantially $\pi L_e$ in length where $L_e$ is given by $$L_e=(\kappa\epsilon_0 V_\theta/2qn_e)^{1/2}$$

$\kappa\epsilon_0$ equals the dielectric constant; $V_\theta$ equals the thermal voltage; $n_e$ equals $(np)^{1/2}$; $n$ is the electron density at a point in said region; and $p$ is the hole density at the same point.

References Cited in the file of this patent

UNITED STATES PATENTS

| | | |
|---|---|---|
| 2,822,310 | Stieltjes | Feb. 4, 1958 |
| 2,843,516 | Herlet | July 15, 1958 |
| 2,870,052 | Rittmann | Jan. 20, 1959 |
| 2,885,571 | Williams | May 5, 1959 |

UNITED STATES PATENT OFFICE
CERTIFICATE OF CORRECTION

Patent No. 2,953,488 September 20, 1960

William Shockley

It is hereby certified that error appears in the printed specification of the above numbered patent requiring correction and that the said Letters Patent should read as corrected below.

Column 6, line 20, for "$V_O$" read -- $V_\theta$ --; column 8, line 10, for "$V_e$" read -- $V_\theta$ --.

Signed and sealed this 11th day of April 1961.

(SEAL)

Attest:
ERNEST W. SWIDER

Attesting Officer

ARTHUR W. CROCKER
Acting Commissioner of Patents